United States Patent
Hanaoka

(10) Patent No.: US 8,917,117 B2
(45) Date of Patent: Dec. 23, 2014

(54) COMPOSITE SEMICONDUCTOR DEVICE REDUCING MALFUNCTIONS OF POWER SEMICONDUCTOR ELEMENT SWITCHING OPERATION

(75) Inventor: Masayuki Hanaoka, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 1133 days.

(21) Appl. No.: 12/878,611

(22) Filed: Sep. 9, 2010

(65) Prior Publication Data

US 2011/0110068 A1    May 12, 2011

(30) Foreign Application Priority Data

Sep. 16, 2009  (JP) ................. 2009-214615

(51) Int. Cl.
*H03B 1/00* (2006.01)
*H03K 3/00* (2006.01)
*H01L 29/739* (2006.01)
*H01L 29/866* (2006.01)
*H01L 27/06* (2006.01)

(52) U.S. Cl.
CPC ......... *H01L 29/7395* (2013.01); *H01L 27/0629* (2013.01); *H01L 29/866* (2013.01)
USPC ........................................................ 327/108

(58) Field of Classification Search
USPC ........................................ 327/108, 112, 109
See application file for complete search history.

(56) References Cited

U.S. PATENT DOCUMENTS

| | | | |
|---|---|---|---|
| 5,629,542 A | 5/1997 | Sakamoto et al. | |
| 5,970,964 A * | 10/1999 | Furuhata et al. | ............. 123/644 |
| 6,268,628 B1 | 7/2001 | Yoshida et al. | |
| 6,539,928 B2 | 4/2003 | Kohno et al. | |
| 6,595,194 B1 | 7/2003 | Ito et al. | |

FOREIGN PATENT DOCUMENTS

| | | |
|---|---|---|
| EP | 1 139 566 A1 | 10/2001 |
| JP | 8-167838 A | 6/1996 |
| JP | 9-307103 A | 11/1997 |
| JP | 10-166126 A | 6/1998 |
| JP | 10-248237 A | 9/1998 |
| JP | 11-289084 A | 10/1999 |
| JP | 2001-284589 A | 10/2001 |
| JP | 2002-115637 A | 4/2002 |
| WO | WO 01/90572 A1 | 11/2001 |

* cited by examiner

*Primary Examiner* — Hai L Nguyen
(74) *Attorney, Agent, or Firm* — Birch, Stewart, Kolasch & Birch, LLP

(57) ABSTRACT

To provide a composite semiconductor device capable of preventing malfunction of preventing electrical circuits and contributing to miniaturization of a power converter. A composite semiconductor device 10 has a structure in which a first power semiconductor element 13 that passes current from a second terminal C1 to a third terminal E1 according to a signal input from a first terminal G1 and a second power semiconductor element 16 that passes current from a second terminal C2 to a third terminal E2 according to a signal input from a first terminal G2 are formed in a single substrate (chip) 20. The third terminal E2 of the second power semiconductor element 16 is electrically connected to the first terminal G1 of the first power semiconductor element 13. A current path for transferring electric charge from the second terminal C1 of the first power semiconductor element 13 to the first terminal G2 of the second power semiconductor element 16 when the potential of the second terminal C1 of the first power semiconductor element 13 is increased with time is provided.

8 Claims, 13 Drawing Sheets

COMPOSITE SEMICONDUCTOR DEVICE REDUCING MALFUNCTIONS OF POWER SEMICONDUCTOR ELEMENT SWITCHING OPERATION

BACKGROUND OF THE INVENTION

1. Field of the Invention

The present invention relates to a composite semiconductor device and, more particularly to, a composite semiconductor device having a power semiconductor element.

2. Description of the Related Art

There is known a power converter as typified by an internal combustion ignition device that drives an inductor load using a switching element. FIG. 13 is a simple circuit diagram of the internal combustion ignition device.

An internal combustion ignition device 100 of FIG. 13 has an ignition coil 101, a switching element 102 connected to the primary side of the ignition coil 101, and a spark plug 103 connected to the secondary side of the ignition coil 101. When an ignition signal is input to a terminal 104 of the switching element 102, primary current is made intermittent to induce high tension current to the secondary side of the ignition coil 101, and the spark plug 103 converts the high tension current into a spark for ignition.

As the switching element used in the internal combustion ignition device, a thyristor, a GTO (Gate Turn-Off thyristor), or the like has been generally used. However, the switching time of such a switching element is several microseconds, the current change rate thereof is comparatively low, and the surge voltage thereof is comparatively small.

In recent years, a voltage drive type high-speed switching element that operates with a switching time shorter than that of the thyristor or GTO, such as an IGBT (Insulated Gate Bipolar Transistor) or a MOSFET (MOS Field Effect Transistor) has come to be used as the abovementioned switching element 102 and applied in various fields.

The above high-speed switching element performs high-speed switching operation with a switching time one order of magnitude shorter than the thyristor or GTO. Accordingly, the current change rate of a main circuit (circuit connected to the primary side of the ignition coil 101) and the surge voltage also becomes considerably large unless the inductance of the main circuit is reduced significantly. When the surge voltage becomes considerably large, voltage exceeding rated voltage is applied to the high-speed switching element itself, which may result in destruction due to overvoltage. This further may induce large noise to adversely affect peripheral devices. Further, the current interruption speed of the switching element on the primary side of the mutual inductance circuit (ignition coil 101) is too high, so that electromotive voltage is generated due to a parasitic inductance on the primary side, which may cause malfunction of other electric circuits.

Under such circumstances, Patent Document 1 discloses a power converter that increases the speed of the switching operation of a high-speed switching element to suppress the current change rate at the switching operation time, to reduce a switching loss, to suppress surge voltage and to reduce noise given to an external apparatus.

In Patent Document 1, a voltage command correction means using a capacitor and a resistor is provided so as to suppress the voltage change rate and current change rate at the OFF-time of the switching element. Further, Patent Document 1 discloses that the switching element and voltage command correction means are housed in a single package.

CITATION LIST

Patent Document

[Patent Document 1] Jpn. Pat. Appln. Laid-Open Publication No. 10-248237

However, in the conventional power converter disclosed in Patent Document 1, it is necessary to adjust a capacitance C and resistance R of the capacitor and resistor constituting the voltage command correction means in order to control the voltage change rate and current change rate, so that switching element and voltage command correction means are inevitably constituted by individual elements, preventing sufficient miniaturization of the power converter.

SUMMARY OF THE INVENTION

In view of the above problems, an object of the present invention is to provide a composite semiconductor device capable of preventing malfunction of electrical circuits and contributing to miniaturization of a power converter.

To solve the above problems, a composite semiconductor device according to the present invention is configured as follows.

A first composite semiconductor device has a structure in which a first power semiconductor element that passes current from a second terminal to a third terminal according to a signal input from a first terminal and a second power semiconductor element that passes current from a second terminal to a third terminal according to a signal input from a first terminal are formed in a single substrate (chip). The third terminal of the second power semiconductor element is electrically connected to the first terminal of the first power semiconductor element. A current path for transferring electric charge from the second terminal of the first power semiconductor element to the first terminal of the second power semiconductor element when the potential of the second terminal of the first power semiconductor element is increased with time is provided.

A second composite semiconductor device is the composite semiconductor device configured as described above, in which a diode is preferably connected between the third terminal of the second power semiconductor element and the first terminal of the first power semiconductor element so as to produce rectification in the direction from the third terminal of the second power semiconductor element to the first terminal of the first power semiconductor element.

A third composite semiconductor device is the composite semiconductor device configured as described above, in which a resistor is preferably provided between the first terminal of the second power semiconductor element and the third terminal of the second power semiconductor element so as to cause current to be supplied from the third terminal of the second power semiconductor element when the potential of the second terminal of the first power semiconductor element is increased with time.

A fourth composite semiconductor device is the composite semiconductor device configured as described above, in which the resistor is preferably formed of polysilicon, and the concentration of dopant in the polysilicon is controlled to compensate the temperature characteristics of the first and second power semiconductor elements.

A fifth composite semiconductor device is the composite semiconductor device configured as described above, in which an operational interference suppression layer is preferably provided between the third terminal of the first power semiconductor element and the third terminal of the second power semiconductor element.

A sixth composite semiconductor device is the composite semiconductor device configured as described above, in which the length of the operational interference suppression layer is preferably 50 μm or more.

A seventh composite semiconductor device is the composite semiconductor device configured as described above, in which the ratio of the area of the first power semiconductor element relative to the area of the second power semiconductor element is preferably 15 or more.

An eighth composite semiconductor device is the composite semiconductor device configured as described above, in which electron irradiation or proton irradiation is preferably applied onto the entire surface of the substrate for lifetime killer processing.

A ninth composite semiconductor device is the composite semiconductor device configured as described above, in which the first and second power semiconductor elements are preferably each formed of an IGBT in which the first terminals of the first and second power semiconductor elements are gate terminals, the second terminals thereof are collector terminals, and the third terminals thereof are emitter terminals.

A tenth composite semiconductor device is the composite semiconductor device configured as described above, in which the first and second power semiconductor elements are preferably each formed of a MOSFET in which the first terminals of the first and second power semiconductor elements are gate terminals, the second terminals thereof are drain terminals, and the third terminals thereof are source terminals.

According to the present invention, there is provided composite semiconductor device having a structure in which a first power semiconductor element that passes current from a second terminal to a third terminal according to a signal input from a first terminal and a second power semiconductor element that passes current from a second terminal to a third terminal according to a signal input from a first terminal are formed in a single substrate (chip). The third terminal of the second power semiconductor element is electrically connected to the first terminal of the first power semiconductor element. A current path for transferring electric charge from the second terminal of the first power semiconductor element to the first terminal of the second power semiconductor element when the potential of the second terminal of the first power semiconductor element is increased with time is provided. With the above configuration, it is possible to prevent malfunction of the electrical circuit. Further, it is possible to contribute to miniaturization of the power converter.

DESCRIPTION OF THE PREFERRED EMBODIMENTS

Preferred embodiments (examples) of the present invention will be described with reference to the accompanying drawings.

Figure 1:
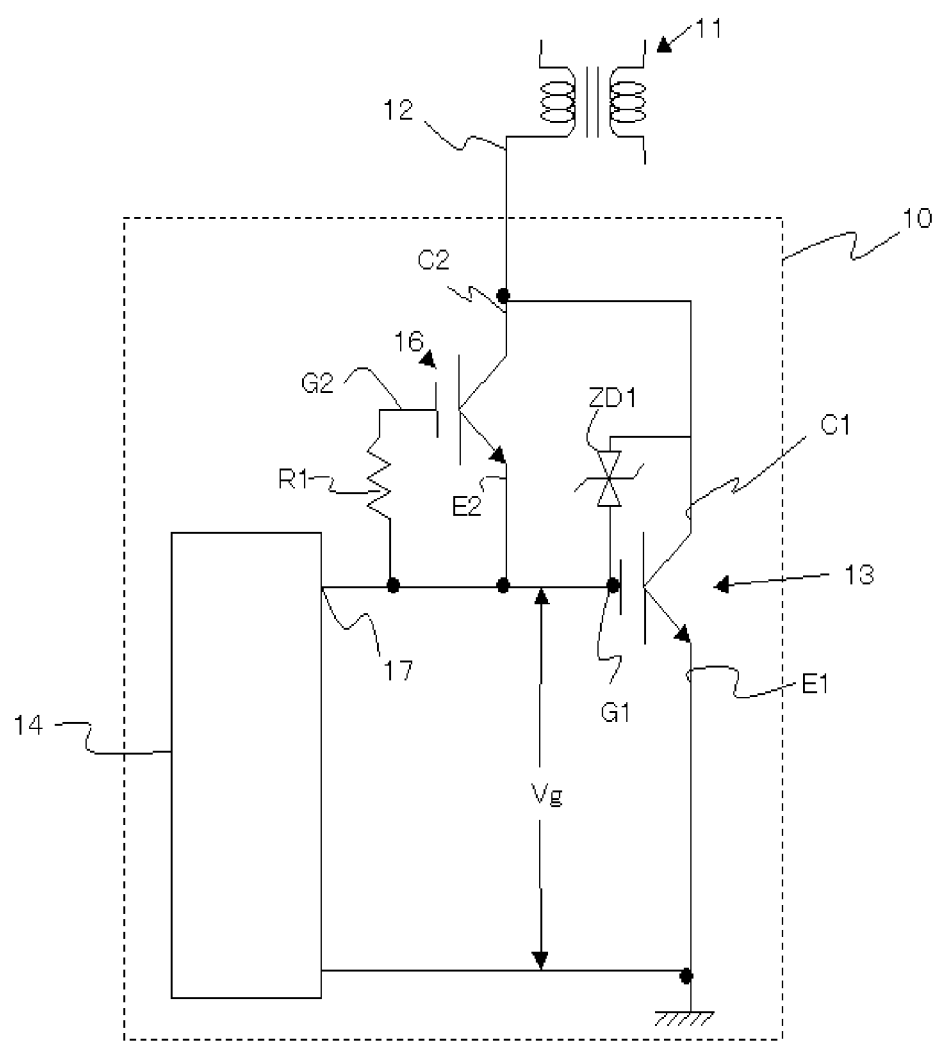
FIG. 1 is a circuit diagram illustrating a configuration of a composite semiconductor device according to a first embodiment of the present invention.

FIG. 1 is a circuit diagram illustrating a configuration of a composite semiconductor device according to a first embodiment of the present invention. In the present embodiment, an IGBT is used as a power semiconductor element constituting the composite semiconductor device. In a composite semiconductor device 10 of FIG. 1, a collector terminal C1 of a first IGBT (main IGBT) 13 is connected to a terminal 12 of a primary side coil of an ignition coil 11. An emitter terminal E1 of the first IGBT 13 is grounded. A gate drive circuit 14 is connected to a gate terminal G1 and the emitter terminal E1 of the first IGBT 13. The gate terminal G1 and collector terminal C1 of the first IGBT 13 are connected to each other through a zener diode ZD 1.

A collector terminal C2 of a second IGBT (feedback IGBT) 16 is connected to the terminal 12 of the primary side coil of the ignition coil 11. An emitter terminal E2 of the second IGBT 16 is connected to the gate terminal G1 of the first IGBT 13. A gate terminal G2 of the second IGBT 16 is connected to a terminal 17 of the gate drive circuit 14 through a resistor R1.

Figure 2:
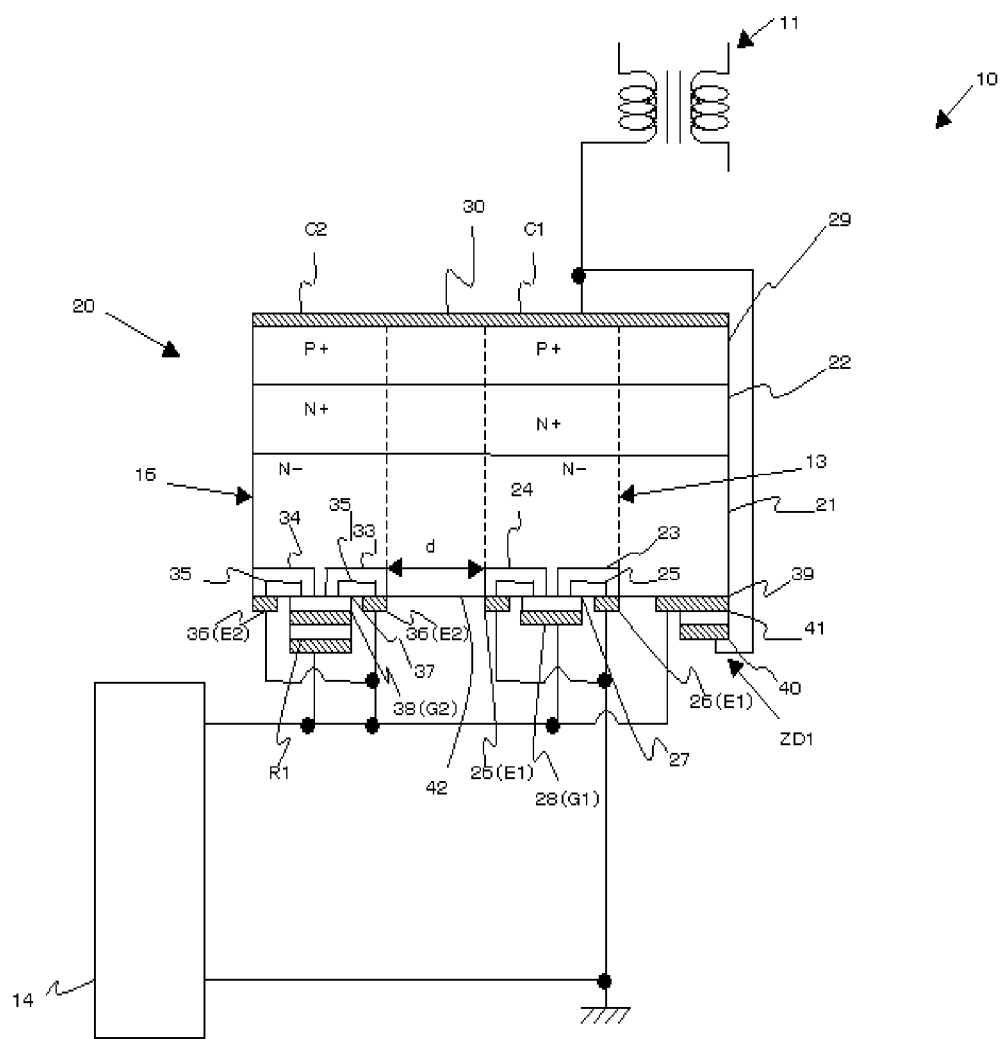
FIG. 2 is a circuit diagram of the composite semiconductor device according to the first embodiment of the present invention in which the first and second IGBTs are illustrated in cross-section.

FIG. 2 is a circuit diagram of the composite semiconductor device according to the first embodiment of the present invention in which the first and second IGBTs are illustrated in cross-section. In the composite semiconductor device 10, a first power semiconductor element (IGBT 13 in the present embodiment) and a second power semiconductor element (IGBT 16 in the present embodiment) are formed in a single substrate (chip) 20. The first IGBT 13 as the first power semiconductor element passes current from the collector terminal (second terminal) C1 to the emitter terminal (third terminal) E1 according to a signal input from the gate terminal (first terminal) G1. The second IGBT 16 as the second power semiconductor element passes current from the collector terminal (second terminal) C2 to the emitter terminal (third terminal) E2 according to a signal input from the gate terminal (first terminal) G2. The substrate 20 is, e.g., a silicon substrate.

The first IGBT 13 includes a first conductive type high-resistance layer (N− type semiconductor layer) 21, a first conductive type buffer layer (N+ type semiconductor layer) 22 formed above the high-resistance layer 21 in the drawing, a second conductive type base layer (P type semiconductor layer) 23 and a P type semiconductor layer 24 which are formed below the first conductive type high-resistance layer 21 in the drawing, a first conductive type emitter region (N+ type semiconductor layer) 25 formed on the lower surface of the second conductive type base layer, an emitter electrode 26 connected to the emitter region 25, a gate electrode 28 formed on a channel region 27 of the second conductive type base layer 23 so as to be insulated from the channel region 27, a second conductive type collector layer (P+ type semiconductor layer) 29, and a collector electrode 30 connected to the collector layer 29.

The second IGBT 16 is formed in the same substrate 20 on which the first IGBT 13 is formed with a predetermined interval d from the end portion of the emitter electrode 26 of the first IGBT 13. The second IGBT 16 includes a first conductive type high-resistance layer (N− type semiconductor layer) 21, a first conductive type buffer layer (N+ type semiconductor layer) 22 formed above the high-resistance layer 21 in the drawing, a second conductive type base layer (P type semiconductor layer) 33 and a P type semiconductor layer 34 which are formed below the first conductive type high-resistance layer 21 in the drawing, a first conductive type emitter region (N+ type semiconductor layer) 35 formed on the lower surface of the second conductive type base layer, an emitter electrode 36 connected to the emitter region 35, a gate electrode 38 formed on a channel region 37 of the second conductive type base layer 33 so as to be insulated from the channel region 37, a second conductive type collector layer (P+ type semiconductor layer) 29, and a collector electrode 30 connected to the collector layer 29.

The resistor element R1 is obtained by depositing polysilicon on the surface of the gate electrode 38. By being added with appropriate dopant, the resistor element R1 has a desired electric resistivity.

The zener diode ZD 1 is formed of polysilicon 41 having a semiconductor junction which is formed on the surface of the substrate 20 by polysilicon sandwiched between electrodes 39 and 40 and appropriate dopant.

When gate voltage Vg is turned OFF by the gate drive circuit, the potential of the first collector terminal C1 is increased with time. At this time, the zener diode ZD 1 passes current from the collector terminal C1 side to the gate terminal G1. Further, at this time, the zener diode ZD 1 passes current to the gate terminal G2 of the second IGBT 16 through the resistor element R1. That is, when the potential of the second terminal C1 of the first power semiconductor element 13 is increased with time, a current path passing through the zener diode ZD 1 and the resistor element R1 serves as a current path for charging the first terminal G2 of the second power semiconductor element 16 from the second terminal C1 of the first power semiconductor element 13. As a result, the second IGBT 16 is turned ON to transfer electric charge to the gate terminal G1.

An operational interference suppression layer 42 having a predetermined distance d is provided between the emitter E1 (end portion of the emitter electrode 26 in FIG. 2) of the IGBT 13 as the first power semiconductor element and the emitter E2 (end portion of the emitter electrode 36 in FIG. 2) of the IGBT 16 as the second power semiconductor element. The predetermined distance d is provided so as to prevent current passing from the P base to the N layer of the emitter E2 of the second IGBT 16 from flowing into the region of the adjacently disposed first IGBT 13 in the same substrate 20 when the gate G1 is ON. The length (predetermined distance d) of the operational interference suppression layer is preferably 50 μm or more.

Further, in order to prevent operational interference between the IGBT 13 and the IGBT 16, a manufacturing process of the composite semiconductor device 10 may include lifetime killer processing in which electron irradiation or proton irradiation is applied onto the entire surface forming the gate and emitter of the substrate (chip) 20. This reduces the number of carriers causing current passing from the P base 33 to the N layer of the emitter E2 of the second IGBT 16 to flow into the region of the adjacently disposed first IGBT 13 in the same substrate 20 when the gate G1 is ON, thereby preventing the current from flowing into the first IGBT 13.

In the composite semiconductor device 10, switching operation is performed in which the first IGBT 13 is turned ON/OFF based on gate voltage Vg which is applied between the gate terminal G1 and the emitter terminal E1 of the first IGBT 13 by the gate drive circuit 14 to allow electrical connection between the collector terminal C1 and the emitter terminal E1 of the IGBT 13 to be established (ON) or broken (OFF). Although not illustrated in FIGS. 1 and 2, the first IGBT 13 has a gate capacity, and the composite semiconductor device 10 has a floating inductance caused in the wirings inside the device.

When the above switching operation is performed to bring the first IGBT 13 from OFF to ON states or from ON to OFF states, collector voltage VCE between the collector terminal C1 and the emitter terminal E1 is decreased or increased.

That is, when the gate voltage Vg is reduced to a threshold or less at the time of turning OFF voltage Vg between the gate terminal G1 and the emitter terminal E1, the collector voltage VCE is increased. The increase of the collector voltage VCE causes displacement current to flow from the collector terminal C1 to the gate terminal G1 through the zener diode ZD 1 to charge the gate G1. Similarly, at this time, the gate G2 is charged in the second IGBT 16. As a result, current flows from the emitter E2 of the second IGBT 16 to the gate G1 of the first IGBT 13 to increase the charge amount, with the result that the gate voltage falling rate is reduced. The reduction in the gate voltage falling rate decreases the reduction rate of main current and thereby the current interruption speed is lowered.

Figure 3:
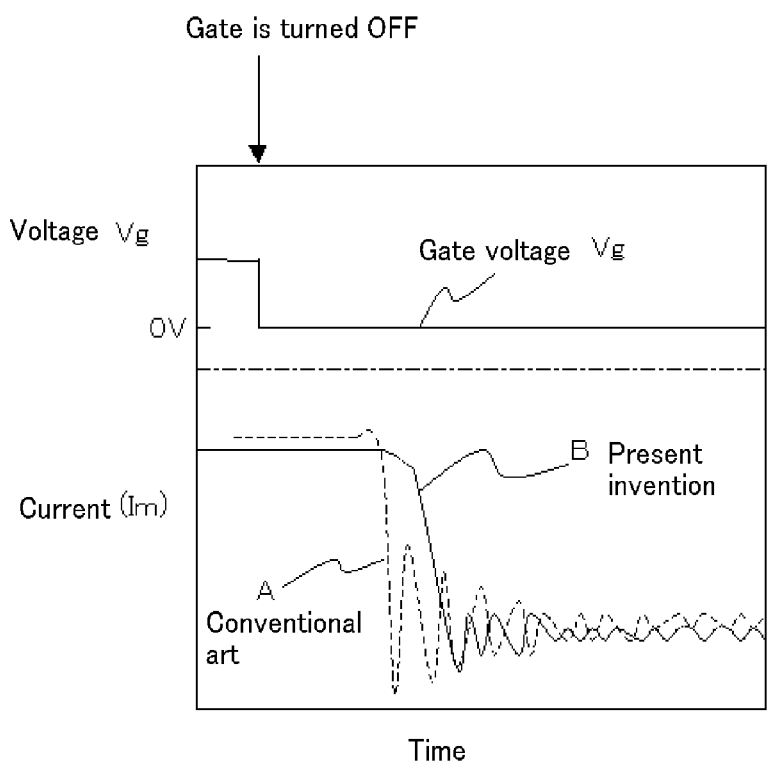
FIG. 3 is a graph illustrating a waveform of main current Im (current flowing between the collector terminal C1 and emitter terminal E1) measured in a circuit constituted by an IGBT (second IGBT 16) having a smaller area and a main IGBT (first IGBT 13) together with a waveform of main current Im measured in a conventional circuit in which the second IGBT 16 is not provided.

FIG. 3 illustrates a waveform of main current Im (current flowing between the collector terminal C1 and the emitter terminal E1) measured in a circuit constituted by the second IGBT 16 and the first IGBT 13 together with a waveform of main current Im measured in a conventional circuit in which the second IGBT 16 is not provided. In FIG. 3, a curve A represents a time dependent change of current in the conventional circuit, and a curve B represents a time dependent change of current in the circuit according to the present invention in which the IGBT 16 is provided. As is clear from FIG. 3, the current interruption speed is lower and current change is smaller in the composite semiconductor device 10 than in the conventional one. Further, a simulation experiment reveals that the ratio of the area of the first power semiconductor element (first IGBT 13) relative to the area of the second power semiconductor element (second IGBT 16) is preferably 15 or more.

As described above, according to the present embodiment, there is provided the composite semiconductor device 10 having a structure in which the first power semiconductor element (first IGBT 13) and the second power semiconductor element (second IGBT 16) are formed in the same substrate 20, in which the emitter E2 of the second power semiconductor element is electrically connected to the gate terminal G1 of the first power semiconductor element, and a current path for transferring electric charge from the second collector terminal C2 of the first power semiconductor element to the gate terminal G2 of the second power semiconductor element when the potential of the second terminal of the first power semiconductor element is increased with time is provided. With the above configuration, it is possible to lower the current interruption speed to reduce the surge voltage to be generated, thereby preventing malfunction of the electrical circuit. Further, it is possible to contribute to miniaturization of the power converter.

A composite semiconductor device according to a second embodiment of the present invention will be described. The second embodiment is configured such that, in the composite semiconductor device of the first embodiment, a diode is connected between the third terminal (emitter) of the second power semiconductor element and the first terminal (gate terminal) of the first power semiconductor element so as to produce rectification in the direction from the third terminal (emitter) of the second power semiconductor element to the first terminal (gate terminal) of the first power semiconductor element. This prevents current passing from the P base 33 to N layer of the emitter of the second IGBT 16 from flowing into the region of the adjacently disposed first IGBT 13 in the same substrate 20 when the gate G1 is ON. In the description of the second embodiment, the same reference numerals as those in the first embodiment are given to the same or corresponding parts as those in the first embodiment, and the descriptions thereof will be omitted here.

Figure 4:
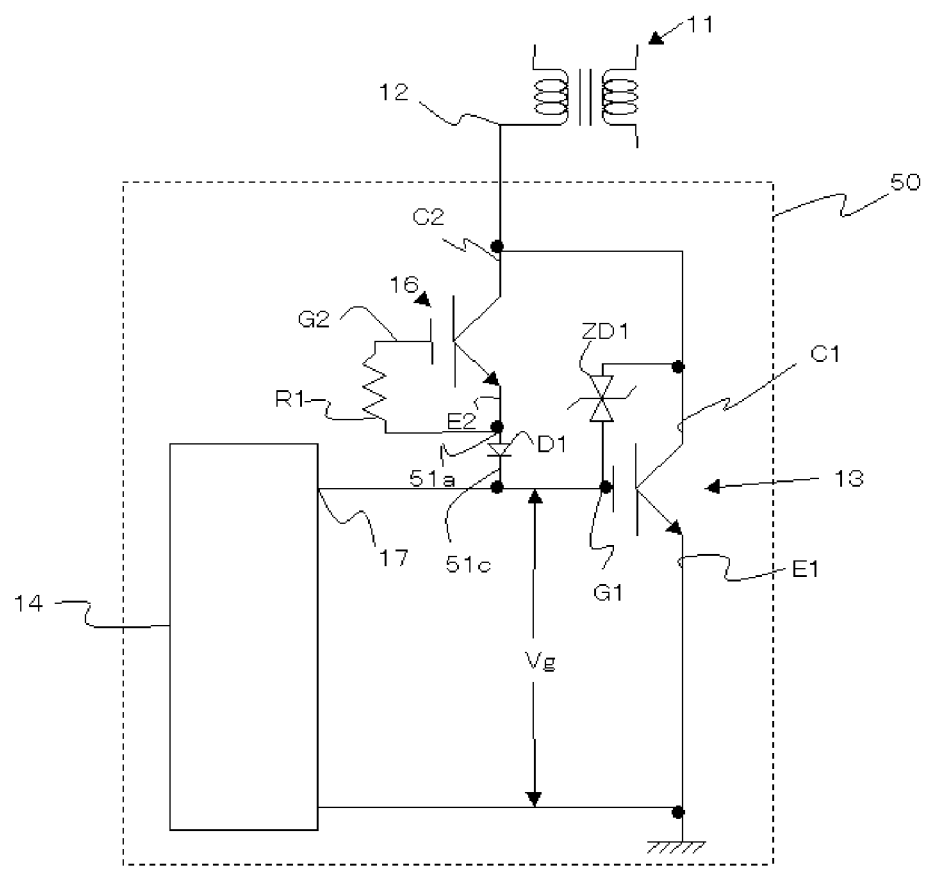
FIG. 4 is a circuit diagram illustrating a configuration of a composite semiconductor device according to the second embodiment of the present invention.

FIG. 4 is a circuit diagram illustrating a configuration of a composite semiconductor device according to the second embodiment of the present invention. An IGBT is used as a power semiconductor element constituting a composite semiconductor device 50 of the present invention. In the composite semiconductor device 50, the first IGBT 13 has the same configuration as that of the first IGBT 13 of the first embodiment.

The collector terminal C2 of the second IGBT (feedback IGBT) 16 is connected to the terminal 12 of the primary side coil of the ignition coil 11. The emitter terminal E2 of the second IGBT 16 is connected to the gate terminal G1 of the first IGBT 13 through a diode D1. The diode D1 is connected so as to produce rectification in the direction from the emitter terminal E2 to the gate terminal G1. That is, an anode terminal 51a of the diode D1 is connected to the emitter terminal E2, and a cathode terminal 51c thereof is connected to the gate terminal G1. Further, the gate terminal G2 of the second IGBT 16 is connected to the anode terminal 51a of the diode D1 through the resistor R1.

Figure 5:
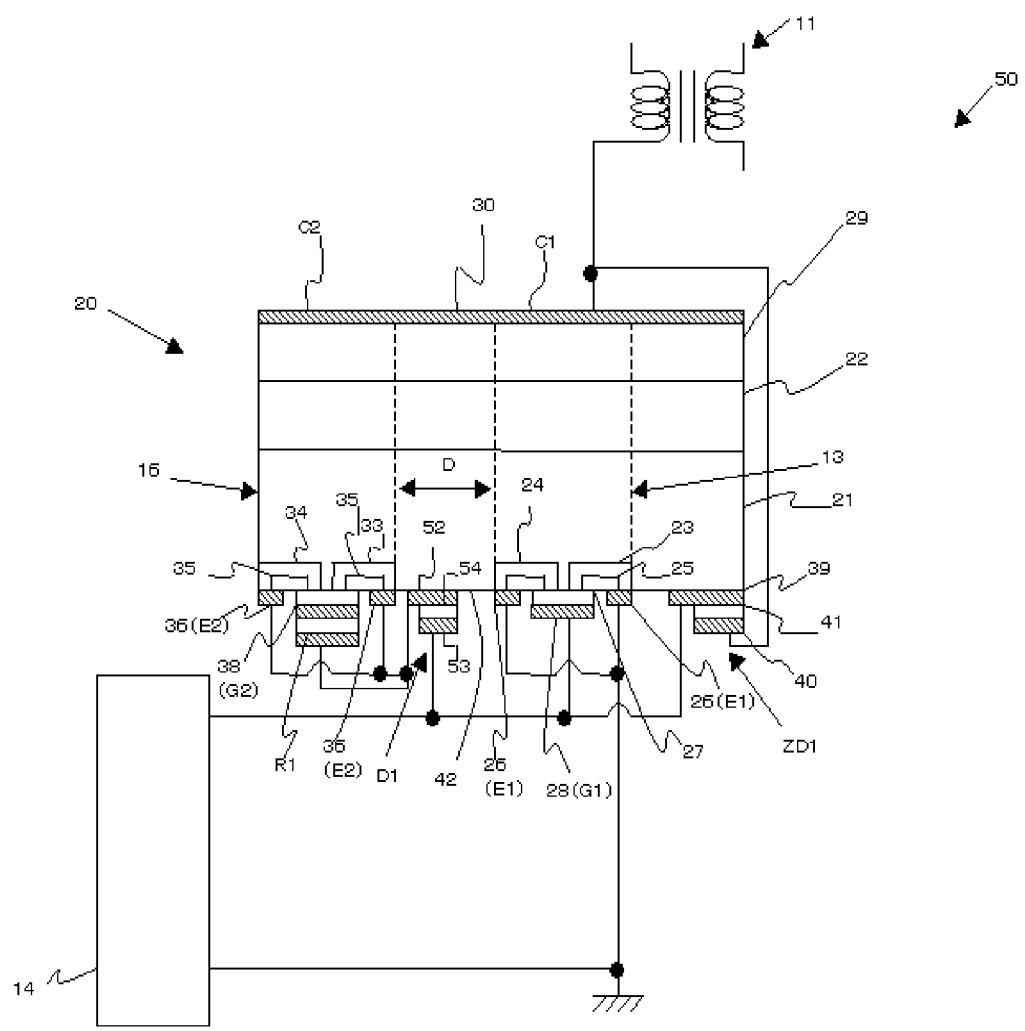
FIG. 5 is a circuit diagram of the composite semiconductor device according to the second embodiment of the present invention in which the first and second IGBTs are illustrated in cross-section.

FIG. 5 is a circuit diagram of the composite semiconductor device according to the second embodiment of the present invention in which the first and second IGBTs are illustrated in cross-section. As in the first embodiment, the composite semiconductor device 50 has a structure in which the first power semiconductor element (IGBT 13 in the present embodiment) and the second power semiconductor element (IGBT 16 in the present embodiment) are formed in a single substrate (chip) 20.

The first IGBT 13, the second IGBT 16, the resistor element R1, and the zener diode ZD 1 are formed in the same fashion as in the first embodiment.

The diode D1 is formed of polysilicon 54 including a PN junction which is formed on the surface of the substrate 20 by polysilicon sandwiched between electrodes 52 and 53 and appropriate dopant. This prevents current from flowing into the emitter E2 when the gate G1 is ON.

In the composite semiconductor device 50, when the above switching operation is performed to bring the first IGBT 13 from ON state to OFF state, the current interruption speed becomes lowered as in the first embodiment.

In the case where the diode D1 is not provided, when predetermined voltage (e.g., +10V) is applied in the state where the gate G1 is ON, current passing from the P base 33 of the emitter E2 of the second IGBT 16 to the N epilayer flows into the region of the adjacent first IGBT 13. In this case, in the case where a current supply ability of the gate drive electrode 14 is low, it is expected that predetermined voltage cannot be maintained and that the voltage cannot reach even to a threshold value. Thus, in order to prevent current from flowing into the second IGBT 16, the diode D1 is provided between the gate terminal G1 and emitter terminal E2. At the ON operation time, the diode D1 interrupts the current, whereby the potential of the gate G1 can be maintained at a predetermined voltage (e.g., +10 V).

When the voltage of the gate G1 becomes 0V, the current is interrupted, so that the potential of the collector terminal C1 is increased to cause displacement current to flow from the collector terminal C1 to the gate G2 of the second IGBT 16 to turn the second IGBT 16 ON. As a result, the current flows from the emitter E2 of the second IGBT 16 to gate G1 through the forward bias diode D1 as in the circuit of the first embodiment. Therefore, by providing the diode D1, it is possible to reduce the distance d between the first IGBT 13 and second IGBT 16 in the same substrate 20.

As described above, according to the present embodiment, there is provided the composite semiconductor device 50 having a structure in which the first power semiconductor element 13 and the second power semiconductor element 16 are formed in the same substrate (chip) 20, in which the emitter E2 of the second power semiconductor element 16 is electrically connected to the gate terminal G1 of the first power semiconductor element 13 through the diode D1, and a current path for transferring electric charge from the collector terminal C1 of the first power semiconductor element (IGBT 13) to the gate terminal G2 of the second power semiconductor element (IGBT 16) when the potential of the collector terminal C1 of the first power semiconductor element (IGBT 13) is increased with time is provided. With the above configuration, it is possible to lower the current interruption speed to thereby prevent malfunction of the electrical circuit. Further, it is possible to reduce the distance between the two IGBTs 13, 16 formed in the single substrate 20 to thereby contribute to miniaturization of the power converter.

With reference to FIGS. 6 to 9, modifications of the composite semiconductor device according to the second embodiment of the present invention will be described. In the description of the modifications, the same reference numerals as those in the second embodiment are given to the same or corresponding parts as those in the second embodiment, and the descriptions thereof will be omitted here.

Figure 6:
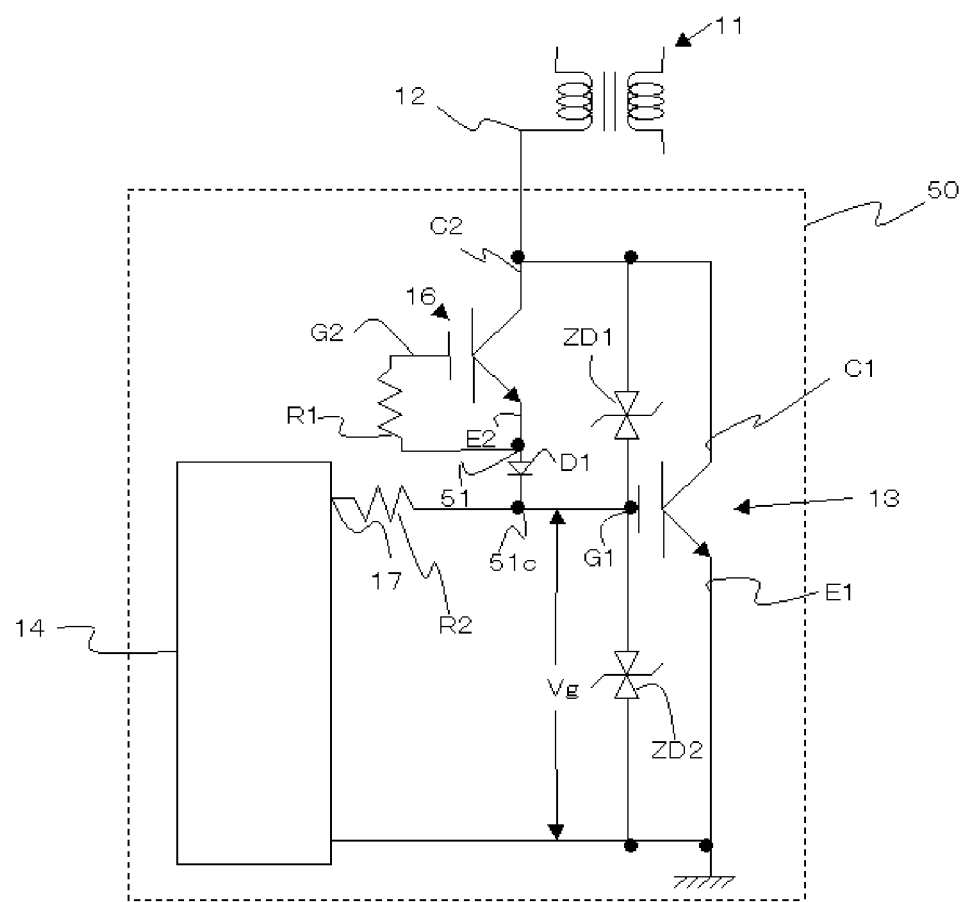
FIG. 6 is a circuit diagram illustrating a first modification of the composite semiconductor device according to the second embodiment of the present invention.

FIG. 6 is a view illustrating a first modification. The first modification is configured such that, in the composite semiconductor device 50 of the second embodiment, a resistor element R2 is provided between the terminal 17 of the gate drive circuit 14 and the cathode terminal 51c of the diode D1. Further, a zener diode ZD 2 is provided between the gate terminal G1 and emitter terminal E1. As described later, when the resistor elements R1 and having different temperature coefficients of the electrical resistivity are appropriately selected and provided, a composite semiconductor device less dependent on the temperature can be obtained. Further, when the gate G1 is turned ON, delay occurs in the accumulation of electric charge in the gate terminal G1 due to existence of the zener diode ZD 2. Accordingly, a current change speed at the time when the gate G1 of the IGBT 13 is turned ON becomes slower, with the result that the surge voltage can be suppressed.

Figure 7:
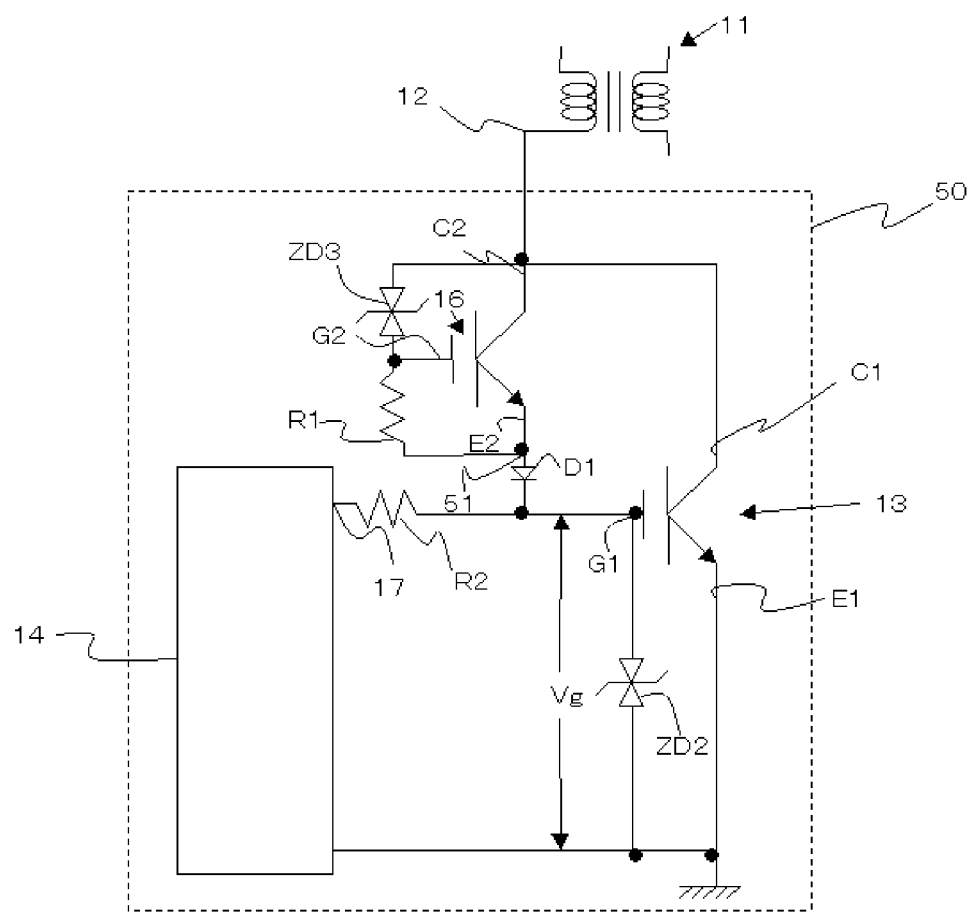
FIG. 7 is a circuit diagram illustrating a second modification of the composite semiconductor device according to the second embodiment of the present invention.

FIG. 7 is a view illustrating a second modification. The second modification is configured such that, in the composite semiconductor device 50 of the second embodiment, a resistor element R2 is provided between the terminal 17 of the gate drive circuit 14 and the terminal of the diode D1. Further, a zener diode ZD 2 is provided between the gate terminal G1 and the emitter terminal E1. Further, the zener diode between the collector terminal C1 and gate terminal G1 is eliminated, while a zener diode ZD 3 is provided between the collector terminal C2 and gate terminal G2. As described later, when the resistor elements R1 and R2 having different temperature coefficients of the electrical resistivity are appropriately selected and provided, a composite semiconductor device less dependent on the temperature can be obtained. Further, when the gate G1 is turned ON, delay occurs in the accumulation of electric charge in the gate terminal G1 due to existence of the zener diode ZD 2. Accordingly, a current change speed at the time when the gate G1 of the IGBT 13 is turned ON becomes slower, with the result that the surge voltage can be suppressed. Further, electric charge flows into the gate G2 through the zener diode ZD 3 when the gate G1 is turned OFF, the amount of electric charge flowing from the second IGBT 16 to the first gate G1, so that a current change speed at the time when the gate G1 of the IGBT 13 is turned OFF becomes slower, with the result that the surge voltage can be suppressed. That is, when the potential of the second terminal (collector terminal C1) of the first power semiconductor element (IGBT 13) is increased with time, a current path passing through the zener diode ZD 3 serves as a current path for transferring electric charge from the second terminal (collector terminal C1) of the first power semiconductor element (IGBT 13) to the first terminal (gate terminal G2) of the second power semiconductor element (IGBT 16).

Figure 8:
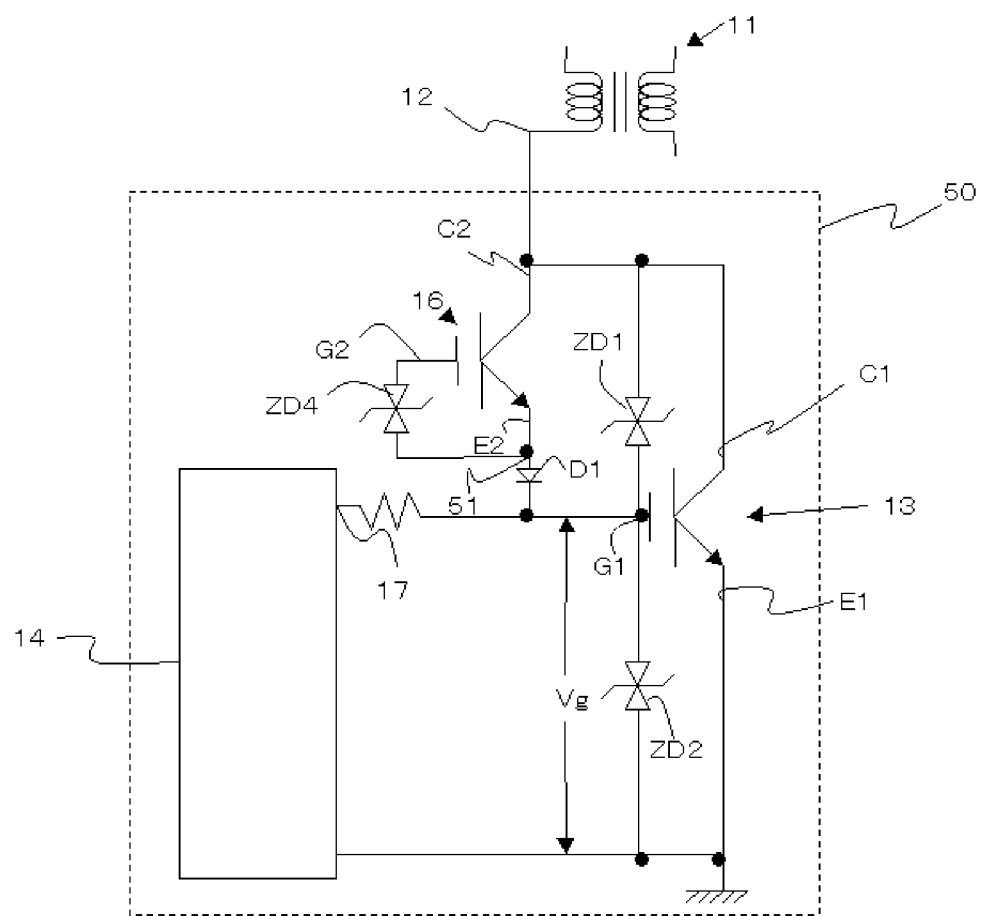
FIG. 8 is a circuit diagram illustrating a third modification of the composite semiconductor device according to the second embodiment of the present invention.

FIG. 8 is a view illustrating a third modification. The third modification is configured such that, in the composite semiconductor device 50 of the second embodiment, a zener diode ZD 4 is provided in place of the resistor element R1 in the first modification. In this case, when the potential of the second terminal (collector terminal C1) of the first power semiconductor element (IGBT 13) is increased with time, a current path passing through the zener diode ZD 1, the diode D1, and the zener diode ZD 4 serves as a current path for transferring electric charge from the second terminal (collector terminal C1) of the first power semiconductor element (IGBT 13) to the first terminal (gate terminal G2) of the second power semiconductor element (IGBT 16).

Figure 9:
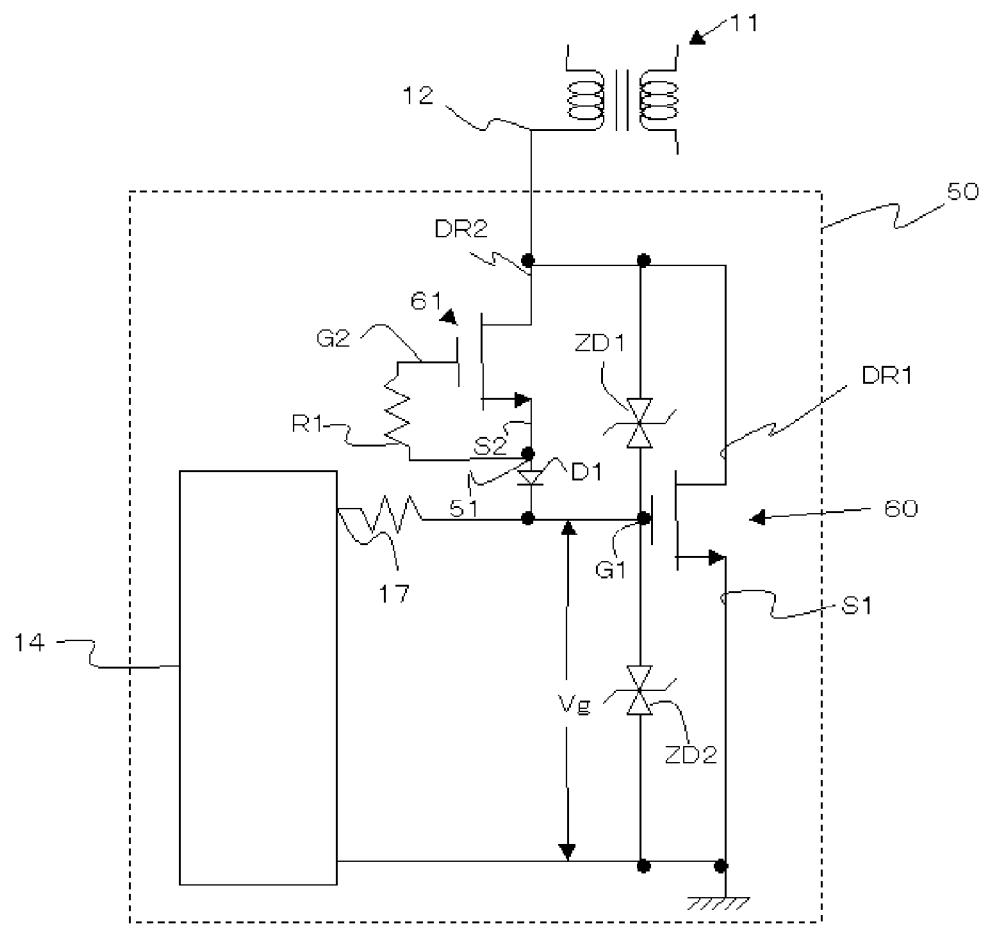
FIG. 9 is a circuit diagram illustrating a fourth modification of the composite semiconductor device according to the second embodiment of the present invention.

FIG. 9 is a view illustrating a fourth modification. In the fourth modification, MOSFETs 60 and 61 which are power semiconductor elements are provided in place of the two IGBTs 13 and 16 of the first modification. In this case, the first terminal corresponds to the gate terminals G1 and G2, the second terminal corresponds to the drain terminals D1 and D2, and the third terminal corresponds to the source terminals S1 and S2.

In the following, results of experiments concerning the reduction of the temperature dependency of the composite semiconductor device which is achieved by appropriately selecting two resistor elements having different temperature coefficients will be described.

Figure 10:
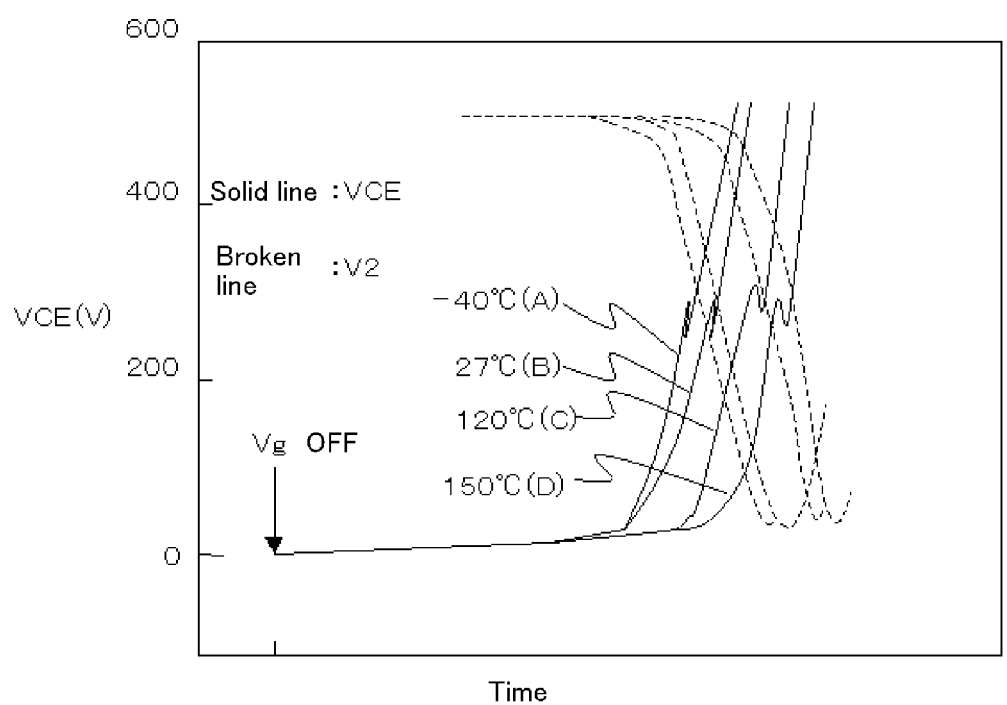
FIG. 10 is a graph illustrating measurement of a time variation of the secondary voltage of the ignition coil with respect to various temperatures conducted using a composite semiconductor device having the circuit of FIG. 6.

FIG. 10 is a graph illustrating measurement of a time variation of the secondary voltage of the ignition coil with respect to various temperatures conducted using a composite semiconductor device having the circuit of FIG. 6. Solid lines each represent a time variation of voltage (VCE) between the collector and emitter of the first IGBT 13. Broken lines each represent a time variation of the secondary voltage of the ignition coil. A curve A represents the time variation at a temperature of −40° C., a curve B represents the time variation at a temperature of 27° C., a curve C represents the time variation at a temperature of 120° C., and a curve D represents the time variation at a temperature of 150° C. As can be seen from FIG. 10, when the device (surrounding) temperature is increased, the increase of the VCE is delayed to delay the timing of generation of the secondary voltage. In FIG. 10, when the timing of generation of the secondary voltage (V2) (i.e., the time required from the time when the gate voltage Vg is turned OFF to time when the V2 reaches a steady-state value) at −40° C. and that at 150° C. are compared, the timing of generation at 150° C. is delayed by about 10 μm as compared to the timing at −40° C.

Figure 11:
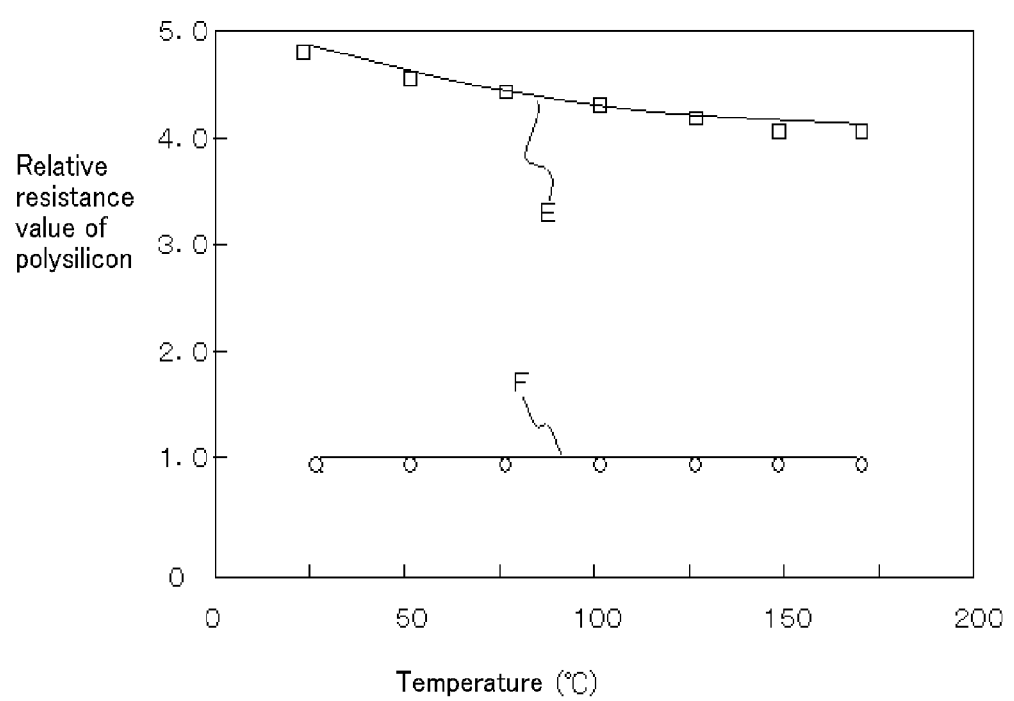
FIG. 11 is a graph illustrating the temperature dependency of the polysilicon resistance.

To improve the above delay, a property that the temperature dependency of the resistance value differs depending on the dose type (phosphorus, boron) and dose concentration of polysilicon constituting the R1 and R2 is utilized. FIG. 11 is a graph illustrating the temperature dependency of the polysilicon resistance. Curves E and F represent the temperature dependencies of the resistance obtained when the dose type and dose concentration are different. It can be understood that the temperature dependency of the resistance value differs depending on the dose type (phosphorus, boron) and dose concentration. The temperature characteristics vary depending on the dose type (dopant) and dose concentration and cannot be uniquely determined. However, by combining the dose type and dose concentration appropriately, a change in the timing of generation of the secondary voltage due to the temperature dependency can be reduced. The resistance value can be controlled depending on the pattern of the polysilicon.

Figure 12:
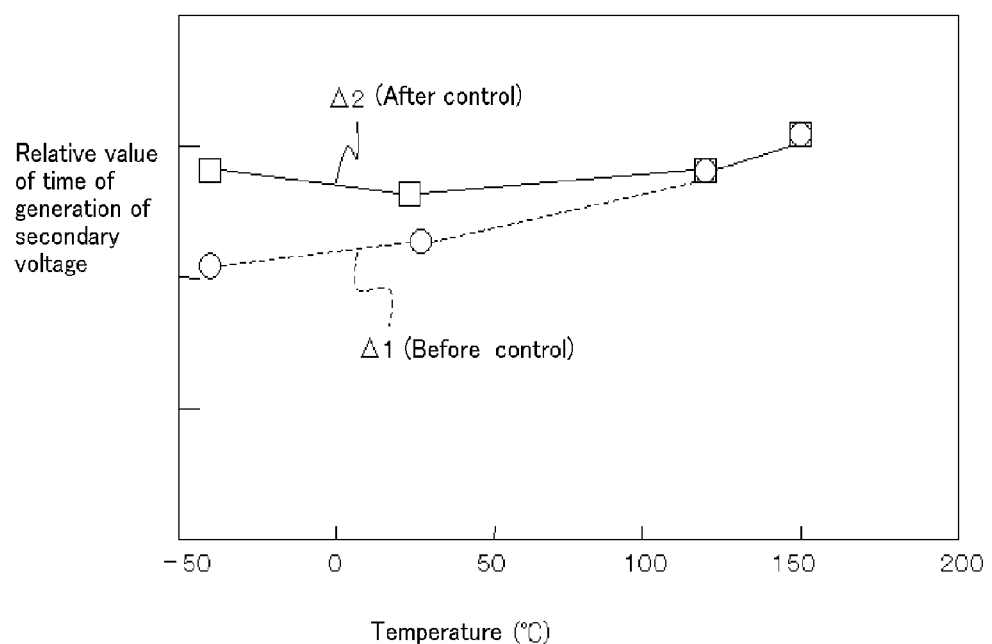
FIG. 12 is graph illustrating the temperature dependency of the timing of generation of the secondary voltage.
Figure 13:
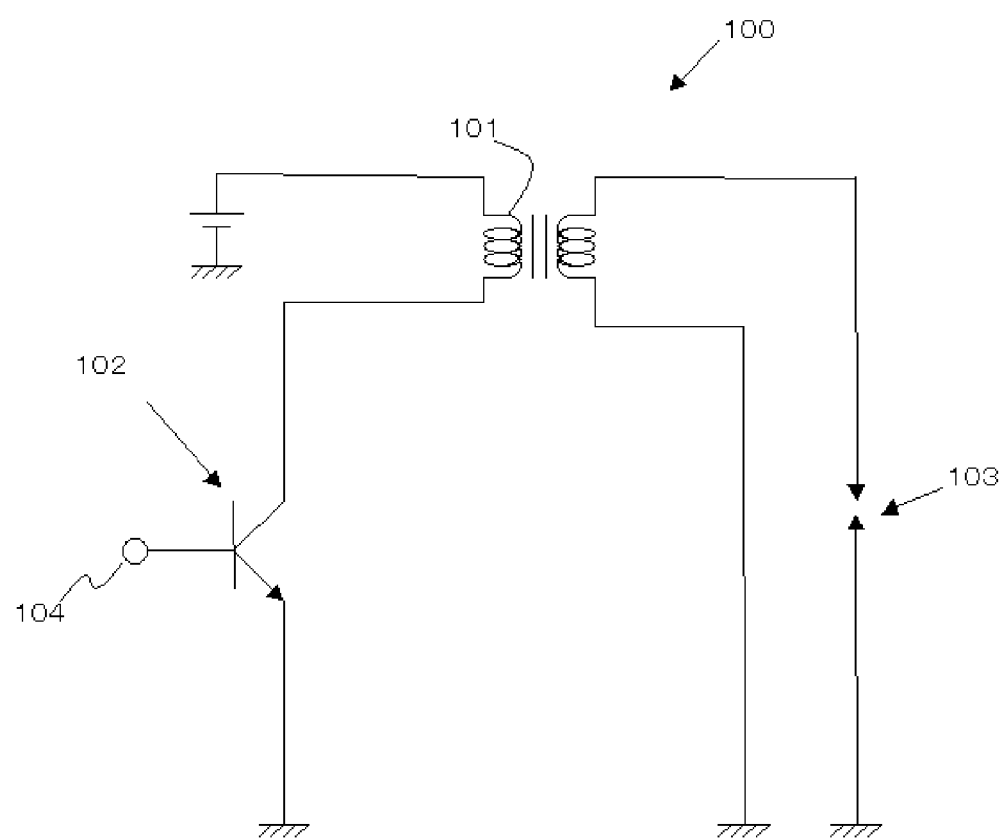
FIG. 13 is a simple circuit diagram of an internal combustion ignition device.

For example, the curves E and F of FIG. 11 represent results obtained by using boron, and the concentration thereof is E<F. Further, in the circuit diagram of FIG. 6, a resistor E (having negative temperature characteristics) is used for R1 and a resistor F (having small temperature characteristic) is used for R2 are used. FIG. 12 is a correlation graph between the timing of generation of the secondary voltage and temperature. Δ1 is obtained when regular resistors are used for the R1 and R2, and Δ2 is obtained when the above combination is used. It can be understood that the Δ2 exhibits a reduced variation in the timing of generation of the secondary voltage with respect to the temperature variation as compared to the Δ1.

As described above, by appropriately selecting two resistors having different temperature coefficients, it is possible to reduce the temperature dependency of the composite semiconductor device.

As described above, according to the present invention, there is provided the composite semiconductor device having a structure in which the first power semiconductor element and second power semiconductor element are formed in the same substrate 20, in which the third terminal of the second power semiconductor element is electrically connected to the first terminal of the first power semiconductor element, and a current path for transferring electric charge from the second terminal of the first power semiconductor element to the first terminal of the second power semiconductor element when the potential of the second terminal of the first power semiconductor element is increased with time is provided. With the above configuration, it is possible to prevent malfunction of the electrical circuit. Further, it is possible to contribute to miniaturization of the power converter.

The configuration, the shape, the size, and the layout described in the above embodiments are only shown in general to an extent enabling the present invention to be understood and carried out, and numerical values and compositions (materials) of configurations are merely examples. Therefore, the present invention is not limited to the embodiments described above and can be modified in various ways so long as the scope of the technical idea shown in the claims is not exceeded.

INDUSTRIAL APPLICABILITY

The composite semiconductor device according to the present invention may be applied to a switching device for use in an internal combustion ignition device.

What is claimed is:

1. A composite semiconductor device having a structure in which a first power semiconductor element and a second power semiconductor element, each having a first terminal, a second terminal, and a third terminal, and each passes current from the second terminal to the third terminal according to a signal input from the first terminal, are formed in a single substrate, wherein the third terminal of the second power semiconductor element is electrically connected to the first terminal of the first power semiconductor element, and a current path for transferring electric charge from the second terminal of the first power semiconductor element to the first terminal of the second power semiconductor element, and another current path for transferring electric charge from the second terminal of the second power semiconductor element to the first terminal of the first power semiconductor element, when the potential of the second terminal of the first power semiconductor element is increased with time, are provided, and a resistor is provided between the first terminal of the second power semiconductor element and the third terminal of the second power semiconductor element so as to cause current to be supplied from the third terminal of the second power semiconductor element to reduce a falling rate of a potential of the first terminal of the first power semiconductor element, when the potential of the first terminal is changed to stop a current between the second terminal and the third terminal in the first power semiconductor element and the potential of the second terminal of the first power semiconductor element is increased with time.

2. The composite semiconductor device according to claim 1, wherein the first and second power semiconductor elements are each formed of an IGBT, and the first terminals of the first and second power semiconductor elements are gate terminals, the second terminals thereof are collector terminals, and the third terminals thereof are emitter terminals.

3. The composite semiconductor device according to claim 1, wherein the first and second power semiconductor elements are each formed of a MOSFET, and the first terminals of the first and second power semiconductor elements are gate terminals, the second terminals thereof are drain terminals, and the third terminals thereof are source terminals.

4. The composite semiconductor device according to claim 1, wherein the resistor is formed of polysilicon, and the concentration of dopant in the polysilicon is controlled to compensate the temperature characteristics of the first and second power semiconductor elements.

5. The composite semiconductor device according to claim 1, wherein an operational interference suppression layer is provided between the third terminal of the first power semiconductor element and the third terminal of the second power semiconductor element.

6. The composite semiconductor device according to claim 5, wherein the length of the operational interference suppression layer is 50 μm or more.

7. The composite semiconductor device according to claim 1, wherein the ratio of the area of the first power semiconductor element relative to the area of the second power semiconductor element is 15 or more.

8. The composite semiconductor device according to claim 1, wherein electron irradiation or proton irradiation is applied onto the entire surface of the chip (substrate) for lifetime killer processing.

* * * * *